United States Patent
Endo et al.

(10) Patent No.: US 9,951,247 B2
(45) Date of Patent: Apr. 24, 2018

(54) POLYMERIZABLE COMPOSITION, CYCLOOLEFIN-BASED POLYMER, CYCLOOLEFIN-BASED RESIN MOLDED BODY, AND LAMINATE

(71) Applicant: ZEON CORPORATION, Tokyo (JP)

(72) Inventors: Mitsuteru Endo, Tokyo (JP); Satoshi Kiriki, Tokyo (JP); Yasuo Tsunogae, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 202 days.

(21) Appl. No.: 14/769,620

(22) PCT Filed: Feb. 19, 2014

(86) PCT No.: PCT/JP2014/053860
§ 371 (c)(1),
(2) Date: Aug. 21, 2015

(87) PCT Pub. No.: WO2014/129486
PCT Pub. Date: Aug. 28, 2014

(65) Prior Publication Data
US 2016/0002490 A1    Jan. 7, 2016

(30) Foreign Application Priority Data

Feb. 22, 2013 (JP) ................. 2013-032832

(51) Int. Cl.

| C09D 145/00 | (2006.01) |
|---|---|
| C08F 232/08 | (2006.01) |
| C09J 165/00 | (2006.01) |
| B32B 15/085 | (2006.01) |
| B32B 15/20 | (2006.01) |
| B32B 27/32 | (2006.01) |
| H05K 1/03 | (2006.01) |
| C08G 61/08 | (2006.01) |

(52) U.S. Cl.
CPC .......... *C09D 145/00* (2013.01); *B32B 15/085* (2013.01); *B32B 15/20* (2013.01); *B32B 27/325* (2013.01); *C08F 232/08* (2013.01); *C09J 165/00* (2013.01); *H05K 1/0326* (2013.01); *B32B 2605/00* (2013.01); *C08G 61/08* (2013.01); *C08G 2261/3325* (2013.01); *C08G 2261/418* (2013.01)

(58) Field of Classification Search
CPC . C09D 145/00; C08G 61/08; C08G 2261/418
See application file for complete search history.

(56) References Cited

U.S. PATENT DOCUMENTS 5,312,940 A * 5/1994 Grubbs .............. C07F 15/002
526/943

FOREIGN PATENT DOCUMENTS

| CN | 1 834 785 | * | 9/2006 |
|---|---|---|---|
| CN | 1834785 A | | 9/2006 |
| EP | 1818327 A1 | | 8/2007 |
| JP | 56-110681 A | | 9/1981 |
| JP | H05247193 A | | 9/1993 |
| JP | 10-182799 A | | 7/1998 |
| JP | 10-251343 A | | 9/1998 |
| JP | 2007-146033 A | | 6/2007 |
| JP | 2009-221126 A | | 10/2009 |
| JP | 2010-229166 A | | 10/2010 |
| KR | 20110134282 A | | 12/2011 |

OTHER PUBLICATIONS

Frederick (J.A.C.S. 81 (1959) 3350-3356).*
CN 1 834 785 translation (2006).*
International Search Report dated Jun. 3, 2014, issued in counterpart application No. PCT/JP2014/053860 (2 pages).
Translation of Written Opinion dated Jun. 3, 2014, issued in counterpart International Application No. PCT/JP2014/053860 (4 pages).
Extended (Supplementary) European Search Report dated Aug. 12, 2016, issued in counterpart European Patent Application No. 14754807.7. (6 pages).
Office Action dated Apr. 25, 2017, issued in Japanese Patent Application No. JP2015-501471, with English machine translation.

* cited by examiner

*Primary Examiner* — Kuo Liang Peng

(74) *Attorney, Agent, or Firm* — Westerman, Hattori, Daniels & Adrian, LLP

(57) ABSTRACT

The present invention pertains to: a polymerizable composition comprising a cycloolefin-based monomer represented by a formula (I), and a polymerization catalyst, wherein $R^1$ is a hydrocarbon group having 1 to 10 carbon atoms, a halogen atom, etc, m is an integer from 0 to 6n+6, and n is an integer from 1 to 3. As a result of the present invention, a polymerizable composition that is useful as a material for producing a cycloolefin-based resin formed article that exhibits excellent adhesion to a metal, a cycloolefin-based polymer obtained from the polymerizable composition, a cycloolefin-based resin formed article, and a laminate that includes a metal foil and a cycloolefin-based resin layer that is situated adjacent to the metal foil are provided.

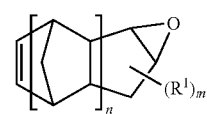

(I)

6 Claims, No Drawings

POLYMERIZABLE COMPOSITION, CYCLOOLEFIN-BASED POLYMER, CYCLOOLEFIN-BASED RESIN MOLDED BODY, AND LAMINATE

TECHNICAL FIELD

The present invention relates to a polymerizable composition that is useful as a material for producing a cycloolefin-based resin formed article that exhibits excellent adhesion to a metal, a cycloolefin-based polymer obtained by polymerizing the polymerizable composition, a cycloolefin-based resin formed article obtained by subjecting the polymerizable composition to bulk polymerization, and a laminate that includes a metal foil and a cycloolefin-based resin layer that is situated adjacent to the metal foil and formed by subjecting the polymerizable composition to bulk polymerization.

BACKGROUND ART

A cycloolefin-based resin exhibits excellent transparency, excellent heat resistance, low water absorption, a low dielectric constant, and the like, and has been used in a wide variety of fields (e.g., optical parts, electronic devices, medical equipment, and automotive parts) in recent years.

For example, Patent Document 1 discloses a resin formed article that is produced by subjecting a norbornene-based monomer to bulk polymerization in the presence of a metathesis polymerization catalyst. Patent Document 1 states that the resin formed article is useful as a camera lens and the like.

RELATED-ART DOCUMENT

Patent Document

Patent Document 1: JP-A-2010-229166

SUMMARY OF THE INVENTION

Technical Problem

A cycloolefin-based resin exhibits excellent properties as described above, but normally exhibits poor affinity to a metal. Therefore, it may be difficult to produce a cycloolefin-based resin formed article that exhibits excellent adhesion to a metal.

The invention was conceived in view of the above situation. An object of the invention is to provide a polymerizable composition that is useful as a material for producing a cycloolefin-based resin formed article that exhibits excellent adhesion to a metal, a cycloolefin-based polymer obtained by polymerizing the polymerizable composition, a cycloolefin-based resin formed article obtained by subjecting the polymerizable composition to bulk polymerization, and a laminate that includes a metal foil and a cycloolefin-based resin layer that is situated adjacent to the metal foil and formed by subjecting the polymerizable composition to bulk polymerization.

Solution to Problem

The inventors of the invention conducted extensive studies in order to solve the above technical problem. As a result, the inventors found that a polymerizable composition that includes a specific cycloolefin-based monomer and a polymerization catalyst can produce a cycloolefin-based resin formed article that exhibits excellent adhesion to a metal. This finding has led to the completion of the invention.

Several aspects of the invention provide the following polymerizable composition (see (1) to (5)), polymer (see (6)), resin formed article (see (7)), and laminate (see (8)).
(1) A polymerizable composition including a cycloolefin-based monomer represented by the following formula (I), and a polymerization catalyst,

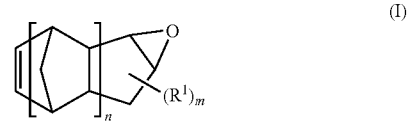

wherein $R^1$ is a substituent selected from the group consisting of a hydrocarbon group having 1 to 10 carbon atoms, a halogen atom, and a hydrocarbon group having 1 to 10 carbon atoms that is substituted with a halogen atom, m is an integer from 0 to 6n+6, provided that one or more $R^1$ are bonded at an arbitrary position when m is equal to or larger than 1, and $R^1$ are either identical or different when m is equal to or larger than 2, and n is an integer from 1 to 3.
(2) The polymerizable composition according to (1), wherein the cycloolefin-based monomer represented by the formula (I) is 4,5-epoxytricyclo[5.2.1.0$^{2,6}$]dec-8-ene.
(3) The polymerizable composition according to (1), wherein the polymerization catalyst is a metathesis polymerization catalyst.
(4) The polymerizable composition according to (1), wherein the polymerization catalyst is a ruthenium carbene complex.
(5) The polymerizable composition according to (1), further including a cycloolefin-based monomer other than the cycloolefin-based monomer represented by the formula (I).
(6) A cycloolefin-based polymer obtained by polymerizing the polymerizable composition according to any one of (1) to (5).
(7) A cycloolefin-based resin formed article obtained by subjecting the polymerizable composition according to any one of (1) to (5) to bulk polymerization.
(8) A laminate including a metal foil, and a cycloolefin-based resin layer that is situated adjacent to the metal foil and formed by subjecting the polymerizable composition according to any one of (1) to (5) to bulk polymerization.

Advantageous Effects of the Invention

The aspects of the invention thus provide a polymerizable composition that is useful as a material for producing a cycloolefin-based resin formed article that exhibits excellent adhesion to a metal, a cycloolefin-based polymer obtained by polymerizing the polymerizable composition, a cycloolefin-based resin formed article obtained by subjecting the polymerizable composition to bulk polymerization, and a laminate that includes a metal foil and a cycloolefin-based resin layer that is situated adjacent to the metal foil and formed by subjecting the polymerizable composition to bulk polymerization.

DESCRIPTION OF EMBODIMENTS

A polymerizable composition, a cycloolefin-based polymer, a cycloolefin-based resin formed article, and a laminate according to the exemplary embodiments of the invention are described in detail below.

1) Polymerizable Composition

A polymerizable composition according to one embodiment of the invention includes a cycloolefin-based monomer represented by the formula (I) (hereinafter may be referred to as "cycloolefin-based monomer (α)"), and a polymerization catalyst.

Cycloolefin-Based Monomer (α)

The cycloolefin-based monomer (α) is a compound that has an alicyclic structure that includes carbon atoms in the molecule, and includes a polymerizable (ring-opening polymerizable or addition polymerizable) carbon-carbon double bond and an epoxy group within the alicyclic structure. It is possible to efficiently form a cycloolefin-based resin formed article that exhibits excellent adhesion to a metal by utilizing the polymerizable composition that includes the cycloolefin-based monomer (α).

$R^1$ in the formula (I) is a substituent selected from the group consisting of a hydrocarbon group having 1 to 10 carbon atoms (preferably a hydrocarbon group having 1 to 5 carbon atoms), a halogen atom, and a hydrocarbon group having 1 to 10 carbon atoms that is substituted with a halogen atom (preferably a hydrocarbon group having 1 to 5 carbon atoms that is substituted with a halogen atom).

Examples of the hydrocarbon group having 1 to 10 carbon atoms that may be represented by $R^1$ include an alkyl group having 1 to 10 carbon atoms, such as a methyl group, an ethyl group, and a propyl group; an alkenyl group having 2 to 10 carbon atoms, such as a vinyl group, a propenyl group, and a crotyl group; an alkynyl group having 2 to 10 carbon atoms, such as an ethynyl group, a propargyl group, and a 3-butynyl group; an aryl group having 6 to 10 carbon atoms, such as a phenyl group, a 1-naphthyl group, and a 2-naphthyl group; a cycloalkyl group having 3 to 10 carbon atoms, such as a cyclopropyl group, a cyclopentyl group, and a cyclohexyl group; and the like.

Examples of the halogen atom that may be represented by $R^1$ include a fluorine atom, a chlorine atom, a bromine atom, and the like.

Examples of the hydrocarbon group having 1 to 10 carbon atoms that is substituted with a halogen atom that may be represented by $R^1$ include a chloromethyl group, a 2-chloroethyl group, a trifluoromethyl group, a pentafluoroethyl group, and the like.

m is an integer from 0 to 6n+6, and preferably an integer from 0 to 4. One or more $R^1$ are bonded at an arbitrary position when m is equal to or larger than 1. $R^1$ are either identical or different when m is equal to or larger than 2. n is an integer from 1 to 3, preferably 1 or 2, and more preferably 1.

Examples of the cycloolefin-based monomer (α) include the compound represented by the formula (I) wherein n is 1, such as 4,5-epoxytricyclo[5.2.1.0$^{2,6}$]dec-8-ene, 4,5-epoxy-8-chlorotricyclo[5.2.1.0$^{2,6}$]dec-8-ene,
4,5-epoxy-8-methyltricyclo[5.2.1.0$^{2,6}$]dec-8-ene, and
4,5-epoxy-8-trifluoromethyltricyclo[5.2.1.0$^{2,6}$]dec-8-ene;
the compound represented by the formula (I) wherein n is 2, such as
10,11-epoxypentacyclo[7.4.0.1$^{2,5}$.1$^{7,13}$.0$^{8,12}$]pentadec-3-ene and
10,11-epoxy-4-chloropentacyclo[7.4.0.1$^{2,5}$.1$^{7,13}$.0$^{8,12}$]pentadec-3-ene; and
the compound represented by the formula (I) wherein n is 3, such as
14,15-epoxyheptacyclo[8.7.0.1$^{2,9}$.0$^{3,8}$.1$^{4,7}$.1$^{11,17}$.0$^{12,16}$]eicos-6-ene and
14,15-epoxy-5-chloroheptacyclo[8.7.0.1$^{2,9}$.0$^{3,8}$.1$^{4,7}$.1$^{11,17}$.0$^{12,16}$]eicos-5-ene.

Among these, the compound represented by the formula (I) wherein n is 1 is preferable, and 4,5-epoxytricyclo[5.2.1.0$^{2,6}$]dec-8-ene is more preferable, since the desired cycloolefin-based resin formed article can be efficiently formed.

These cycloolefin-based monomers (α) may be used either alone or in combination.

The cycloolefin-based monomer (α) may be obtained by epoxidizing a dicyclopentadiene dimer, a dicyclopentadiene trimer, or a dicyclopentadiene tetramer, for example. The epoxidation reaction may be effected using a known reaction that utilizes a heteropolyacid and hydrogen peroxide or the like (see JP-A-2006-104110, for example). When effecting the epoxidation reaction using a heteropolyacid and hydrogen peroxide, selective epoxidation can be achieved by adjusting the amount of hydrogen peroxide.

Additional Cycloolefin-Based Monomer

The polymerizable composition according to one embodiment of the invention may include an additional cycloolefin-based monomer (hereinafter may be referred to as "cycloolefin-based monomer (β)") that is copolymerizable with the cycloolefin-based monomer (α) as long as the advantageous effects of the invention are not impaired.

The cycloolefin-based monomer (β) is not particularly limited as long as the cycloolefin-based monomer (β) is a cycloolefin-based monomer other than the cycloolefin-based monomer (α), and is copolymerizable with the cycloolefin-based monomer (α). Examples of the cycloolefin-based monomer (β) include a monocyclic cycloolefin compound, a norbornene compound, and the like. The cycloolefin-based monomer (β) may be substituted with a substituent. Examples of the substituent include a hydrocarbon group having 1 to 10 carbon atoms, a halogen atom, a hydrocarbon group having 1 to 10 carbon atoms that is substituted with a halogen atom, and the like. Specific examples of these substituents include those mentioned above in connection with the cycloolefin-based monomer (α).

Specific examples of the monocyclic cycloolefin compound include cyclobutene, cyclopentene, 3-methylcyclopentene, 4-methylcyclopentene, 3,4-dimethylcyclopentene, 3,5-dimethylcyclopentene, 3-chlorocyclopentene, cyclohexene, 3-methylcyclohexene, 4-methylcyclohexene, 3,4-dimethylcyclohexene, 3-chlorocyclohexene, 3-vinylcyclohexene, 4-vinylcyclohexene, cycloheptene, cyclooctene, cyclododecene, 1,3-cyclopentadiene, 1,3-cyclohexadiene, 1,4-cyclohexadiene, 5-ethyl-1,3-cyclohexadiene, 1,3-cycloheptadiene, 1,3-cyclooctadiene, and the like.

Specific examples of the norbornene compound include a dicyclic norbornene compound such as norbornene, 1-methyl-2-norbornene, 5-methyl-2-norbornene, 7-methyl-2-norbornene, 5-ethyl-2-norbornene, 5-propyl-2-norbornene, 5-phenyl-2-norbornene, 5,6-dimethyl-2-norbornene, 5,5,6-trimethyl-2-norbornene, 5-chloro-2-norbornene, 5,5-dichloro-2-norbornene, 5-fluoro-2-norbornene, 5,5,6-trifluoro-6-trifluoromethyl-2-norbornene, 5-chloromethyl-2-norbornene, 5-methylidyne-2-norbornene, 5-ethylidene-2-norbornene, 5-n-propylidene-2-norbornene, 5-isopropylidene-2-norbornene, 5-vinyl-2-norbornene, 5-allyl-2-norbornene, 5,6-diethylidene-2-norbornene, 5-cyclohexenyl-2-norbornene, and 2,5-norbornadiene; a tricyclic norbornene compound such as dicyclopentadiene (cyclopentadiene dimer), 1,2-dihydrodicyclopentadiene, and 5,6-dihydrodicyclopentadiene; a tetracyclic norbornene compound such as 1,4,5,8-dimethano-1,2,3,4,4a,5,8,8a-octahydronaphthalene (TCD), 2-methyl-1,4, 5,8-dimethano-1,2,3,4,4a,5,8,8a-octahydronaphthalene, 2-ethyl-1,4,5,8-dimethano-1,2,3,4,4a,5,8,8a-octahydronaphthalene, 2,3-dimethyl-1,4,5,8-dimethano-1,2,3,4,4a, 5,8,8a-octahydronaphthalene, 2-hexyl-1,4,5,8-dimethano-1, 2,3,4,4a,5,8,8a-octahydronaphthalene, 2-ethylidene-1,4,5,8-dimethano-1,2,3,4,4a,5,8,8a-octahydronaphthalene, 2-fluoro-1,4,5,8-dimethano-1,2,3,4,4a,5,8,8a-octahydronaphthalene, 1,5-dimethyl-1,4,5,8-dimethano-1,2,3,4,4a, 5,8,8a-octahydronaphthalene, 2-cyclohexyl-1,4,5,8-dimethano-1,2,3,4,4a,5,8,8a-octahydronaphthalene, 2,3-dichloro-1,4,5,8-dimethano-1,2,3,4,4a,5,8,8a-octahydronaphthalene, and 2-isobutyl-1,4,5,8-dimethano-1, 2,3,4,4a,5,8,8a-octahydronaphthalene; a pentacyclic norbornene compound such as a cyclopentadiene trimer; a heptacyclic norbornene compound such as a cyclopentadiene tetramer; and the like.

These cycloolefin-based monomers (β) may be used either alone or in combination.

When the polymerizable composition according to one embodiment of the invention includes the cycloolefin-based monomer (β), the cycloolefin-based monomer (β) is normally included in the polymerizable composition in an amount of 99.9 parts by weight or less, preferably 10 to 99.5 parts by weight, more preferably 10 to 99 parts by weight, and particularly preferably 50 to 98 parts by weight, based on 100 parts by weight of the cycloolefin-based monomer (α) and the cycloolefin-based monomer (β) in total.

Polymerization Catalyst

The polymerizable composition according to one embodiment of the invention includes the polymerization catalyst. Examples of the polymerization catalyst include a metathesis polymerization catalyst, an addition polymerization catalyst, and the like. The polymerization catalyst may be appropriately selected corresponding to the type of the desired polymer.

Metathesis Polymerization Catalyst

The metathesis polymerization catalyst that may be included in the polymerizable composition according to one embodiment of the invention is not particularly limited. A known metathesis polymerization catalyst may be used as the metathesis polymerization catalyst. Examples of the metathesis polymerization catalyst include a transition metal complex in which a plurality of ions, atoms, polyatomic ions, compounds, and the like are bonded to a transition metal atom (center atom). Examples of the transition metal atom include the atoms that belong to Group 5, 6, and 8 in the long-form periodic table (hereinafter the same). Examples of the atoms that belong to Group 5 include tantalum. Examples of the atoms that belong to Group 6 include molybdenum and tungsten. Examples of the atoms that belong to Group 8 include ruthenium and osmium.

It is preferable that the metathesis polymerization catalyst is a complex that includes ruthenium or osmium as the center atom, and more preferably a complex that includes ruthenium as the center atom.

A ruthenium carbene complex in which a carbene compound is coordinated to ruthenium is preferable as the complex that includes ruthenium as the center atom. The term "carbene compound" is a generic name for compounds that include a free methylene group, and refers to a compound that includes a divalent carbon atom (carbene carbon) that does not have a charge represented by ">C:". The ruthenium carbene complex exhibits excellent catalytic activity during bulk polymerization. Therefore, when a resin formed article is produced by subjecting the polymerizable composition according to one embodiment of the invention to bulk polymerization, the resulting formed article rarely emits an odor derived from unreacted monomers, and a good formed article can be obtained with high productivity. Since the ruthenium carbene complex is relatively stable with respect to oxygen and moisture in the air, and is not easily deactivated, the ruthenium carbene complex can be used in the atmosphere.

Examples of the ruthenium carbene complex include a complex represented by the following formula (II) and a complex represented by the following formula (III).

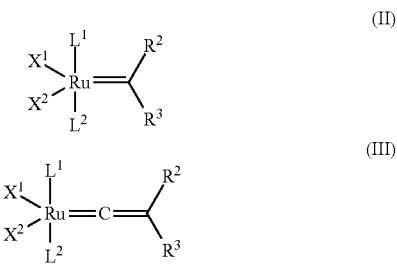

$R^2$ and $R^3$ are independently a hydrogen atom, a halogen atom, or a cyclic or linear hydrocarbon group having 1 to 20 carbon atoms that optionally includes a halogen atom, an oxygen atom, a nitrogen atom, a sulfur atom, a phosphorus atom, or a silicon atom, provided that $R^2$ and $R^3$ are optionally bonded to each other to form an aliphatic ring or an aromatic ring.

$X^1$ and $X^2$ are independently an arbitrary anionic ligand. The anionic ligand represented by $X^1$ and $X^2$ is a ligand that is negatively charged when separated from the center atom. Examples of the anionic ligand represented by $X^1$ and $X^2$ include a halogen atom (e.g., fluorine atom (F), chlorine atom (Cl), bromine atom (Br), and iodine atom (I)); a diketonate group; a substituted cyclopentadienyl group; an alkoxy group; an aryloxy group; a carboxyl group; and the like. Among these, a halogen atom is preferable, and a chlorine atom is more preferable.

$L^1$ and $L^2$ are independently a neutral electron donor compound. The neutral electron donor compound represented by $L^1$ and $L^2$ is a ligand that is electrically neutralized when separated from the center atom.

At least one of $L^1$ and $L^2$ is a hetero atom-containing carbene compound. The term "hetero atom" used herein refers to the atoms that belong to Groups 15 and 16 in the periodic table. Specific examples of the hetero atom include a nitrogen atom (N), an oxygen atom (O), a phosphorus atom (P), a sulfur atom (S), an arsenic atom (As), a selenium atom (Se), and the like. Among these, N, O, P, and S are preferable, and N is particularly preferable, since a stable carbene compound can be obtained.

Examples of the hetero atom-containing carbene compound include a compound represented by the following formula (IV) and a compound represented by the following formula (V).

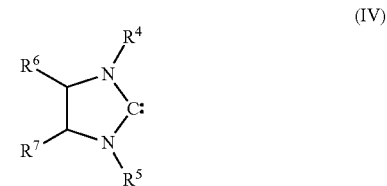

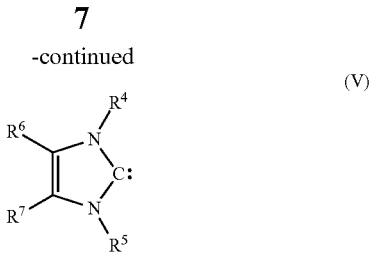

(V)

$R^4$ to $R^7$ are independently a hydrogen atom, a halogen atom, or a cyclic or linear hydrocarbon group having 1 to 20 carbon atoms that optionally includes a halogen atom, an oxygen atom, a nitrogen atom, a sulfur atom, a phosphorus atom, or a silicon atom. $R^4$ to $R^7$ are optionally bonded to each other in an arbitrary combination to form an aliphatic ring or an aromatic ring.

Examples of the compound represented by the formula (IV) and the compound represented by the formula (V) include 1,3-dimesitylimidazolidin-2-ylidene, 1,3-di(1-adamantyl)imidazolidin-2-ylidene, 1,3-dicyclohexylimidazolidin-2-ylidene, 1,3-dimesityloctahydrobenzimidazol-2-ylidene, 1,3-diisopropyl-4-imidazolin-2-ylidene, 1,3-di(1-phenylethyl)-4-imidazolin-2-ylidene, 1,3-dimesityl-2,3-dihydrobenzimidazol-2-ylidene, and the like.

Examples of the neutral electron donor compound other than the hetero atom-containing carbene compound include a carbonyl, an amine, pyridine and derivatives thereof, an ether, a nitrile, an ester, phosphine and derivatives thereof, a thioether, an aromatic compound, an olefin, an isocyanide, a thiocyanate, and the like. Among these, phosphine and derivatives thereof, an ether, and pyridine and derivatives thereof are preferable, and a trialkylphosphine is more preferable.

$R^2$, $R^3$, $X^1$, $X^2$, $L^1$, and $L^2$ are optionally bonded to each other in an arbitrary combination to form a multidentate chelate ligand.

Specific examples of the ruthenium carbene complex include
benzylidene(1,3-dimesitylimidazolydin-2-ylidene)(tricyclohexylphosphine)ruthenium dichloride, (1,3-dimesitylimidazolydin-2-ylidene)(3-methyl-2-buten-1-ylidene) (tricyclopentylphosphine)ruthenium dichloride,
benzylidene(1,3-dimesityloctahydrobenzimidazol-2-ylidene)(tricyclohexylphosphine) ruthenium dichloride,
benzylidene[1,3-di(1-phenylethyl)-4-imidazolin-2-ylidene] (tricyclohexylphosphine) ruthenium dichloride,
benzylidene(1,3-dimesityl-2,3-dihydrobenzimidazol-2-ylidene)(tricyclohexylphosphine) ruthenium dichloride,
benzylidene(tricyclohexylphosphine)(1,3,4-triphenyl-2,3,4,5-tetrahydro-1H-1,2,4-triazol-5-ylidene)ruthenium dichloride,
(1,3-diisopropylhexahydropyrimidin-2-ylidene)(ethoxymethylene) (tricyclohexylphosphine)ruthenium dichloride,
benzylidene(1,3-dimesitylimidazolydin-2-ylidene)pyridineruthenium dichloride, and the like.

These ruthenium carbene complexes can be produced using the method described in Org. Lett., 1999, Vol. 1, p. 953, or Tetrahedron. Lett., 1999, Vol. 40, p. 2247, for example.

These metathesis polymerization catalysts may be used either alone or in combination.

The metathesis polymerization catalyst is normally used so that the molar ratio (metal atoms included in metathesis polymerization catalyst:cycloolefin-based monomer) of the metal atoms included in the metathesis polymerization catalyst to the cycloolefin-based monomer is 1:2,000 to 1:2,000,000, preferably 1:5,000 to 1:1,000,000, and more preferably 1:10,000 to 1:500,000.

Addition Polymerization Catalyst

The addition polymerization catalyst that may be included in the polymerizable composition according to one embodiment of the invention is not particularly limited. Examples of the addition polymerization catalyst include a known Ziegler catalyst and a known metallocene catalyst. It is preferable to use an addition polymerization catalyst that is obtained by reacting a halogen compound of at least one transition metal selected from the transition metals that belong to Groups 8, 9, and 10 in the periodic table (hereinafter may be referred to as "compound (A)") with a compound that includes a metal atom selected from B, Al, Ti, Zn, Ge, Sn, and Sb, and does not include a carbon atom that is bonded directly to the metal atom (hereinafter may be referred to as "compound (B)").

The compound (A) is a halogen compound of at least one transition metal selected from the transition metals that belong to Groups 8, 9, and 10 in the periodic table.

Examples of the transition metal included in the compound (A) include iron, cobalt, nickel, ruthenium, rhodium, palladium, platinum, and the like. Among these, cobalt, nickel, palladium, and platinum are preferable, and nickel and palladium are more preferable.

Examples of the halogen atom included in the compound (A) include a fluorine atom, a chlorine atom, a bromine atom, and an iodine atom. At least one halogen atom is bonded to the transition metal atom.

The compound (A) may include an additional component other than the transition metal atom and the halogen atom. Examples of the additional component include an oxygen atom; a hydroxyl group; a dialkylamino group having 2 to 40 carbon atoms and a diarylamino group having 12 to 40 carbon atoms, such as a dimethylamino group, a diethylamino group, a di(n-propyl)amino group, a di(isopropyl)amino group, a di(n-butyl)amino group, a di(t-butyl)amino group, a di(isobutyl)amino group, a diphenylamino group, and a methylphenylamino group; an alkoxy group having 1 to 20 carbon atoms, such as a methoxy group, an ethoxy group, a propoxy group, and a butoxy group; an aryloxy group having 6 to 20 carbon atoms, such as a phenoxy group, a methylphenoxy group, a 2,6-dimethylphenoxy group, and a naphthyloxy group; an ether such as diethyl ether and tetrahydrofuran; a nitrile such as acetonitrile and benzonitrile; an ester such as ethyl benzoate; phosphine and derivatives thereof such as trimethylphosphine, triethylphosphine, and triphenylphosphine; a Lewis base such as a sulfoxide, an isocyanide, phosphonic acid and derivatives thereof, and a thiocyanate; and the like. Among these, a dialkylamino group, an ether, a nitrile, an ester, and phosphine and derivatives thereof are preferable, and a nitrile, and phosphine and derivatives thereof are more preferable.

Specific examples of the compound (A) include an iron compound such as iron(II) chloride, iron(III) chloride, iron (II) bromide, iron(III) bromide, dichlorobis(triphenylphosphine)iron(II), and dichlorobis(tri-n-butylphosphine)iron (II); a cobalt compound such as cobalt chloride, cobalt bromide, and dichlorobis(triphenylphosphine)cobalt; a nickel compound such as nickel chloride, nickel bromide, dibromobis(triphenylphosphine)nickel, dichlorobis(triphenylphosphine)nickel, dichlorobis(trimethylphosphine) nickel, dichloro(2,2'-bipyridyl)nickel, and dichloro(ethylenediamine)nickel; a ruthenium compound such as ruthenium chloride, chlorotris(triphenylphosphine)ruthenium, hydrochlorotris(triphenylphosphine)ruthenium, chlorotetrakis(acetonitrile)ruthenium, and dichlorotetrakis(dimethyl sulfoxide)ruthenium; a rhodium compound such as rhodium chloride, rhodium bromide, trichlorotris(triphenylphosphine)rhodium, and chlorotris(triphenylphosphine)rhodium; a palladium compound such as palladium(II) chloride, palladium(II) bromide, palladium iodide, dichloro(trimethylphosphine)palladium, dichlorobis(triethylphosphine)palladium, dichlorobis(triphenylphosphine)palladium, dichlorobis(acetonitrile)palladium, and dichlorobis(benzonitrile)palladium; and the like.

The compound (B) is a compound that includes a metal atom selected from B, Al, Ti, Zn, Ge, Sn, and Sb, and does not include a carbon atom that is bonded directly to the metal atom. The expression "does not include a carbon atom that is bonded directly to the metal atom" means that a carbon atom derived from a hydrocarbon group (e.g., alkyl group or alkenyl group) or the like is not bonded directly to the metal atom.

The metal atom included in the compound (B) is selected from B, Al, Ti, Zn, Ge, Sn, and Sb. Among these, B, Al, Ti, Zn, and Sn are preferable, and B, Al, and Ti are more preferable.

It is preferable that the compound (B) have a structure in which a halogen atom is bonded to the metal atom. Examples of the halogen atom include a fluorine atom, a chlorine atom, a bromine atom, and an iodine atom.

The compound (B) may include an additional component other than the metal atom and the halogen atom. Examples of the additional component include an oxygen atom; a hydroxyl group; water; a dialkylamino group having 2 to 40 carbon atoms and a diarylamino group having 12 to 40 carbon atoms, such as a dimethylamino group, a diethylamino group, a di(n-propyl)amino group, a di(isopropyl) amino group, a di(n-butyl)amino group, a di(t-butyl)amino group, a di(isobutyl)amino group, a diphenylamino group, and a methylphenylamino group; an alkoxy group having 1 to 20 carbon atoms, such as a methoxy group, an ethoxy group, a propoxy group, and a butoxy group; an aryloxy group having 6 to 20 carbon atoms, such as a phenoxy group, a methylphenoxy group, a 2,6-dimethylphenoxy group, and a naphthyloxy group; an ether such as diethyl ether and tetrahydrofuran; a nitrile such as acetonitrile and benzonitrile; an ester such as ethyl benzoate; phosphine and derivatives thereof such as triethylphosphine and triphenylphosphine; a Lewis base such as an isocyanide, phosphonic acid and derivatives thereof, and a thiocyanate; and the like. Among these, a hydroxyl group, an alkoxy group, and an aryloxy group are preferable.

Specific examples of the compound (B) include a titanium compound such as titanium(IV) chloride, titanium(IV) bromide, tetraisopropoxytitanium, tetrabutoxytitanium, tetramethoxytitanium, trimethoxytitanium monochloride, dimethoxytitanium dichloride, methoxytitanium trichloride, trihydroxytitanium monochloride, dihydroxytitanium dichloride, hydroxytitanium trichloride, and titanium oxide; a zinc compound such as zinc chloride, zinc bromide, zinc iodide, diethoxyzinc, and zinc oxide; a boron compound such as boron trifluoride, boron trichloride, boron tribromide, boron triiodide, triethoxyboron, and boron oxide; an aluminum compound such as aluminum chloride, aluminum bromide, aluminum iodide, aluminum ethoxide, aluminum isopropoxide, chloroaluminoxane, and aluminum oxide; a tin compound such as tin(IV) fluoride, tin(IV) chloride, tin(IV) bromide, tin(IV) iodide, and tin(IV) oxide; an antimony compound such as antimony(V) chloride, antimony (V) fluoride, and antimony oxide; and the like.

A complex in which water, an ether, an ester, a carboxylic acid, or the like is coordinated to the metal atom may also be used as the compound (B). Specific examples of such a complex include a titanium(IV) chloride tetrahydrofuran (1:2) complex, a boron trichloride methyl sulfide complex, boron trifluoride dihydrate, a boron trifluoride t-butyl methyl ether complex, a boron trifluoride di(n-butyl) ether complex, a boron trifluoride diethyl ether complex, a boron trifluoride tetrahydrofuran complex, a boron trifluoride acetic acid (1:2) complex, aluminum chloride hydrate, tin(IV) chloride hydrate, and the like.

The ratio (compound (A):compound (B)) of the compound (A) to the compound (B) is not particularly limited. The molar ratio (compound (A):compound (B)) of the compound (A) to the compound (B) is normally 1:0.1 to 1:10,000, and preferably 1:0.5 to 1:5,000.

These addition polymerization catalysts may be used either alone or in combination.

The addition polymerization catalyst is normally used so that the molar ratio (metal atoms included in addition polymerization catalyst:cycloolefin-based monomer) of the metal atoms included in the addition polymerization catalyst to the cycloolefin-based monomer is 1:2,000 to 1:2,000,000, preferably 1:5,000 to 1:1,000,000, and more preferably 1:10,000 to 1:500,000.

Additional Component

The polymerizable composition according to one embodiment of the invention may optionally include an additional component other than the cycloolefin-based monomer and the polymerization catalyst. Examples of the additional component include a thermoplastic resin, a filler, a flame retardant, a modifier, a polymerization retarder, a chain transfer agent, an antioxidant, and the like.

A cycloolefin-based resin formed article that exhibits improved properties can be easily obtained when the polymerizable composition includes a thermoplastic resin. Examples of the thermoplastic resin include low-density polyethylene, high-density polyethylene, an ethylene-ethyl acrylate copolymer, an ethylene-vinyl acetate copolymer, polystyrene, a polyphenylene sulfide, a polyphenylene ether, a polyamide, a polyester, a polycarbonate, cellulose triacetate, and the like.

These thermoplastic resins may be used either alone or in combination.

The thermoplastic resin may be used in an arbitrary amount. The thermoplastic resin is normally used in an amount of 1 to 30 parts by weight, and preferably 1 to 20 parts by weight, based on 100 parts by weight of the cycloolefin-based monomer.

A cycloolefin-based resin formed article that exhibits excellent mechanical strength and excellent heat resistance can be easily obtained when the polymerizable composition includes a filler. A known inorganic filler and a known organic filler may be used as the filler.

Examples of the inorganic filler include calcium carbonate, talc, silica, alumina, and the like.

Examples of the organic filler include polyethylene fibers, polypropylene fibers, polyester fibers, a wood powder, a cork powder, and the like.

These fillers may be used either alone or in combination.

The filler is normally used in an amount of 1 to 1,000 parts by weight, and preferably 10 to 500 parts by weight, based on 100 parts by weight of the cycloolefin-based monomer.

A cycloolefin-based resin formed article that exhibits excellent flame retardancy can be easily obtained when the polymerizable composition includes a flame retardant. A known halogen-based flame retardant and a known non-halogen-based flame retardant may be used as the flame retardant.

Examples of the halogen-based flame retardant include tris(2-chloroethyl)phosphate, tris(chloropropyl)phosphate, tris(dichloropropyl)phosphate, chlorinated polystyrene, chlorinated polyethylene, highly chlorinated polypropylene, chlorosulfonated polyethylene, hexabromobenzene, decabromodiphenyl oxide, bis(tribromophenoxy)ethane, 1,2-bis(pentabromophenyl)ethane, tetrabromobisphenol S, tetradecabromodiphenoxybenzene, 2,2-bis(4-hydroxy-3,5-dibromophenylpropane), pentabromotoluene, and the like.

Examples of the non-halogen-based flame retardant include trimethyl phosphate, triethyl phosphate, tributyl phosphate, trioctyl phosphate, tributoxyethyl phosphate, triphenyl phosphate, cresyldiphenyl phosphate, dicresylphenyl phosphate, tricresyl phosphate, trixylenyl phosphate, xylenyldiphenyl phosphate, tri(isopropylphenyl)phosphate, and the like.

These flame retardants may be used either alone or in combination.

The flame retardant is normally used in an amount of 10 to 300 parts by weight, and preferably 20 to 200 parts by weight, based on 100 parts by weight of the cycloolefin-based monomer.

The term "modifier" used herein refers to a compound that can control polymerization activity. Examples of the modifier include a trialkoxyaluminum, a triphenoxyaluminum, a dialkoxyalkylaluminum, an alkoxydialkylaluminum, a trialkylaluminum, a dialkoxyaluminum chloride, an alkoxyalkylaluminum chloride, a dialkylaluminum chloride, a trialkoxyscandium, a tetraalkoxytitanium, a tetraalkoxytin, a tetraalkoxyzirconium, and the like.

These modifiers may be used either alone or in combination.

The modifier is normally used so that the molar ratio (metal atoms included in polymerization catalyst:modifier) of the metal atoms included in the polymerization catalyst to the modifier is 1:0.05 to 1:100, preferably 1:0.2 to 1:20, and more preferably 1:0.5 to 1:10.

The term "polymerization retarder" used herein refers to a compound that can control polymerization activity. An increase in the viscosity of the polymerizable composition can be suppressed by utilizing the polymerization retarder. Examples of the polymerization retarder include a phosphine compound such as triphenylphosphine, tributylphosphine, trimethylphosphine, triethylphosphine, dicyclohexylphosphine, vinyldiphenylphosphine, allyldiphenylphosphine, triallylphosphine, and styryldiphenylphosphine; a Lewis base such as aniline and pyridine; and the like.

These polymerization retarders may be used either alone or in combination. The content of the polymerization retarder in the polymerizable composition may be appropriately adjusted.

The term "chain transfer agent" used herein refers to a compound that causes a chain transfer reaction during a polymerization reaction to adjust the molecular weight of the resulting polymer.

Examples of the chain transfer agent include 1-hexene, 2-hexene, styrene, vinylcyclohexane, allylamine, divinylbenzene, vinyl methacrylate, allyl methacrylate, styryl methacrylate, allyl acrylate, undecenyl methacrylate, styryl acrylate, and the like.

These chain transfer agents may be used either alone or in combination. The chain transfer agent is normally used in an amount of 0.01 to 10 parts by weight, and preferably 0.1 to 5 parts by weight, based on 100 parts by weight of the cycloolefin-based monomer.

The term "antioxidant" used herein refers to a compound that prevents a deterioration in the cycloolefin-based resin formed article due to an oxidation reaction.

Examples of the antioxidant include a phenol-based antioxidant, an amine-based antioxidant, a phosphorus-based antioxidant, a sulfur-based antioxidant, and the like. Among these, a phenol-based antioxidant and an amine-based antioxidant are preferable, and a phenol-based antioxidant is more preferable.

Specific examples of the phenol-based antioxidant include pentaerythritol tetrakis[3-(3,5-di-t-butyl-4-hydroxyphenyl)propionate, octadecyl 3-(3,54-butyl-4-hydroxyphenyl)propionate, N,N'-hexane-1,6-diylbis(3-(3,54-butyl-4-hydroxyphenyl)propionamide), and the like.

These antioxidants may be used either alone or in combination.

The antioxidant is normally used in an amount of 0.0001 to 10 parts by weight, and preferably 0.001 to 5 parts by weight, based on 100 parts by weight of the cycloolefin-based monomer.

Further examples of the additional component include a coloring agent, a light stabilizer, a pigment, a blowing agent, and the like. These additional components may respectively be used either alone or in combination. The content of each additional component is appropriately selected as long as the advantageous effects of the invention are not impaired.

The polymerizable composition according to one embodiment of the invention is prepared by mixing the above components. The components may be mixed using a normal method. For example, a solution (catalyst solution) in which the polymerization catalyst and the polymerization retarder (optional) are dissolved or dispersed in an appropriate solvent, and a solution (monomer solution) that includes the cycloolefin-based monomer (α) and an additional component (optional) are prepared. The catalyst solution is added to the monomer solution, and the mixture is stirred to prepare the polymerizable composition.

The solvent used to prepare the catalyst solution and the solvent used to prepare the monomer solution are not particularly limited. Examples of the solvent include a linear aliphatic hydrocarbon such as n-pentane, n-hexane, n-heptane, liquid paraffin, and mineral spirit; an alicyclic hydrocarbon such as cyclopentane, cyclohexane, methylcyclohexane, dimethylcyclohexane, trimethylcyclohexane, ethylcyclohexane, diethylcyclohexane, decahydronaphthalene, dicycloheptane, tricyclodecane, hexahydroindene, and cyclooctane; an aromatic hydrocarbon such as benzene, toluene, and xylene; a hydrocarbon that includes an alicyclic ring and an aromatic ring, such as indene and tetrahydronaphthalene; a nitrogen-containing hydrocarbon such as nitromethane, nitrobenzene, and acetonitrile; an oxygen-containing hydrocarbon such as diethyl ether and tetrahydrofuran; and the like.

2) Cycloolefin-Based Polymer and Cycloolefin-Based Resin Formed Article Cycloolefin-Based Polymer A cycloolefin-based polymer according to one embodiment of the invention is obtained by polymerizing the polymerizable composition according to one embodiment of the invention. A metathesis ring-opening polymer is obtained through a ring-opening metathesis polymerization reaction when the polymerizable composition according to one embodiment of the invention includes the metathesis polymerization catalyst. An addition polymer is obtained through an addition polymerization reaction when the polymerizable composition according to one embodiment of the invention includes the addition polymerization catalyst.

The ring-opening polymerization reaction can be effected by polymerizing the polymerizable composition that includes the metathesis polymerization catalyst. The ring-opening polymerization reaction may be effected using an arbitrary method. For example, the ring-opening polymerization reaction may be effected by solution polymerization or bulk polymerization. It is preferable to utilize a bulk polymerization reaction since a resin formed article can be efficiently produced. The details of the bulk polymerization reaction are described later in connection with the cycloolefin-based resin formed article.

An arbitrary solvent may be used when effecting the ring-opening polymerization reaction by solution polymerization. It is preferable to use a hydrocarbon-based solvent. Examples of the hydrocarbon-based solvent include an aromatic hydrocarbon such as benzene, toluene, and xylene; a linear aliphatic hydrocarbon such as n-pentane, hexane, and heptane; an alicyclic hydrocarbon such as cyclopentane, cyclohexane, and cyclooctane; and the like. Among these, an aromatic hydrocarbon and an aliphatic hydrocarbon are preferable, toluene, cyclohexane, cyclooctane, and the like are more preferable, and toluene and cyclohexane are particularly preferable.

These hydrocarbon-based solvents may be used either alone or in combination. It is preferable to utilize a bulk polymerization reaction since a cycloolefin-based resin formed article can be efficiently produced.

The solution polymerization temperature is not particularly limited. The solution polymerization temperature is normally −30 to 150° C., and preferably −10 to 120° C. The polymerization time is not particularly limited. The polymerization time is normally 1 minute to 100 hours.

The addition polymerization reaction can be effected by polymerizing the polymerizable composition that includes the addition polymerization catalyst. The addition polymerization reaction may be effected using an arbitrary method. For example, the addition polymerization reaction may be effected by solution polymerization or bulk polymerization. It is preferable to utilize solution polymerization since the reaction can be easily controlled.

An arbitrary solvent may be used when effecting solution polymerization. Examples of the solvent include those mentioned above in connection with the ring-opening polymerization reaction.

The addition polymerization temperature is not particularly limited. The addition polymerization temperature is normally −30 to 150° C., and preferably −10 to 120° C. The polymerization time is not particularly limited. The polymerization time is normally 1 minute to 100 hours.

The weight average molecular weight (Mw) of the cycloolefin-based polymer according to one embodiment of the invention is normally 5,000 to 500,000, and preferably 10,000 to 100,000 (depending on the application). Note that the weight average molecular weight (Mw) of the cycloolefin-based polymer refers to a polystyrene-equivalent value determined by gel permeation chromatography using tetrahydrofuran as the solvent.

The glass transition temperature (Tg) of the cycloolefin-based polymer according to one embodiment of the invention is normally 120 to 200° C., and preferably 140 to 180° C.

The cycloolefin-based polymer according to one embodiment of the invention includes an epoxy group derived from the cycloolefin-based monomer (α), and exhibits excellent affinity to a metal. Therefore, the cycloolefin-based polymer according to one embodiment of the invention is preferably used as a material for forming a metal-resin composite.

Cycloolefin-Based Resin Formed Article

A resin formed article according to one embodiment of the invention is obtained by subjecting the polymerizable composition according to one embodiment of the invention to bulk polymerization. It is preferable to use the polymerizable composition that includes the metathesis polymerization catalyst when effecting the bulk polymerization reaction. It is possible to efficiently produce the desired cycloolefin-based resin formed article by subjecting the polymerizable composition that includes the metathesis polymerization catalyst to bulk polymerization (ring-opening polymerization).

The polymerizable composition may be subjected to bulk polymerization (to obtain the cycloolefin-based resin formed article) using (a) a method that applies the polymerizable composition to a support, and subjects the polymerizable composition to bulk polymerization, (b) a method that injects the polymerizable composition into a mold, and subjects the polymerizable composition to bulk polymerization, or (c) a method that impregnates a fibrous reinforcing material with the polymerizable composition, and subjects the polymerizable composition to bulk polymerization, for example.

Examples of the support used for the method (a) include a film and a sheet formed of a resin (e.g., polytetrafluoroethylene, polyethylene terephthalate, polypropylene, polyethylene, polycarbonate, polyethylene naphthalate, polyarylate, or nylon); a foil and a sheet formed of a metal material (e.g., iron, stainless steel, copper, aluminum, nickel, chromium, gold, or silver); and the like. It is preferable to use a metal foil or a resin film as the support.

The thickness of the metal foil or the resin film is normally 1 to 200 μm, preferably 1 to 150 μm, more preferably 6 to 125 μm, and still more preferably 12 to 100 μm, from the viewpoint of workability and the like.

It is preferable that the metal foil have a flat and smooth surface. The surface roughness (Rz) of the metal foil measured using an atomic force microscope (AFM) is normally 10 μm or less, preferably 5 μm or less, and more preferably 3 μm or less.

It is preferable that the surface of the metal foil be treated with a known coupling agent (e.g., silane coupling agent, thiol coupling agent, or titanate coupling agent), a known adhesive, or the like.

The polymerizable composition according to one embodiment of the invention may be applied to the support using a known coating method (e.g., spray coating method, dip coating method, roll coating method, curtain coating method, die coating method, or slit coating method).

The polymerizable composition that has been applied to the support is optionally dried, and subjected to bulk polymerization. The polymerizable composition is subjected to bulk polymerization by heating the polymerizable composition to a given temperature. The polymerizable composition may be heated using an arbitrary method. For example, the polymerizable composition may be heated using a method that heats the polymerizable composition that has been applied to the support on a heating plate, a method that heats the polymerizable composition while applying pressure using a press (hot pressing), a method that presses the polymerizable composition using a heated roll, or a method that heats the polymerizable composition in a heating furnace.

A film-like or sheet-like cycloolefin-based resin formed article (i.e., a cycloolefin-based resin formed article provided with the support) is obtained by utilizing the method (a). The thickness of the resin formed article is normally 15 mm or less, preferably 5 mm or less, more preferably 0.5 mm or less, and most preferably 0.1 mm or less.

Examples of the mold used for the method (b) include a known mold such as a mold having a split mold structure (i.e., a mold including a core mold and a cavity mold). The core mold and the cavity mold are produced so as to form a cavity that corresponds to the shape of the desired formed article. The shape, the material, the size, and the like of the mold are not particularly limited. A sheet-like or film-like resin formed article may be produced using a mold in which two glass sheets, metal sheets, or the like are combined with a spacer having a given thickness.

When using the method (b), the polymerizable composition is injected into the cavity of the mold, and subjected to bulk polymerization.

The pressure (injection pressure) applied when injecting the polymerizable composition into the cavity of the mold is normally 0.01 to 10 MPa, and preferably 0.02 to 5 MPa. If the injection pressure is too low, the pattern formed on the inner circumferential surface of the cavity may not be satisfactorily transferred. If the injection pressure is too high, it may be uneconomical since it is necessary to increase the rigidity of the mold. The clamping pressure is normally 0.01 to 10 MPa. The polymerizable composition may be heated using a method that utilizes a heating means (e.g., hot plate or steam) provided to the mold, or a method that heats the mold in an electric furnace, for example.

A cycloolefin-based resin formed article having an arbitrary shape can be obtained by utilizing the method (b). Examples of the shape of the cycloolefin-based resin formed article include a sheet-like shape, a film-like shape, a pillar-like shape, a cylindrical shape, a polygonal pillar-like shape, and the like.

Examples of the fibrous reinforcing material used for the method (c) include organic fibers such as polyethylene terephthalate (PET) fibers, aramid fibers, ultra-high-molecular-weight polyethylene fibers, polyamide (nylon) fibers, and liquid crystal polyester fibers; inorganic fibers such as glass fibers, carbon fibers, alumina fibers, tungsten fibers, molybdenum fibers, titanium fibers, steel fibers, boron fibers, silicon carbide fibers, and silica fibers; and the like. Among these, organic fibers and glass fibers are preferable, and aramid fibers, liquid crystal polyester fibers, and glass fibers are particularly preferable. E-glass fibers, NE-glass fibers, S-glass fibers, D-glass fibers, H-glass fibers, or the like may preferably be used as the glass fibers. These fibers may be used either alone or in combination. The configuration of the fibrous reinforcing material is not particularly limited. The fibrous reinforcing material may be a mat, cloth, a nonwoven fabric, or the like.

The fibrous reinforcing material may be impregnated with the polymerizable composition by applying a given amount of the polymerizable composition to the fibrous reinforcing material using a known method (e.g., spray coating method, dip coating method, roll coating method, curtain coating method, die coating method, or slit coating method), optionally placing a protective film on the fibrous reinforcing material, and pressing the fibrous reinforcing material (from the upper side) using a roller or the like, for example.

After impregnating the fibrous reinforcing material with the polymerizable composition, the fibrous reinforcing material is heated to a given temperature to effect bulk polymerization to obtain the desired resin formed article.

The content of the fibrous reinforcing material in the resin formed article is normally 10 to 90 wt %, preferably 20 to 80 wt %, and more preferably 30 to 70 wt %. When the content of the fibrous reinforcing material is within the above range, the resulting laminate exhibits dielectric properties and mechanical strength in a well-balanced manner.

The fibrous reinforcing material impregnated with the polymerizable composition may be heated using a method that places the fibrous reinforcing material on a support, and heats the fibrous reinforcing material as described above in connection with the method (a), or a method that places the fibrous reinforcing material in a mold, impregnates the fibrous reinforcing material with the polymerizable composition in the mold, and heats the fibrous reinforcing material as described above in connection with the method (b), for example.

A sheet-like or film-like cycloolefin-based resin formed article that includes the fibrous reinforcing material is obtained by utilizing the method (c). The thickness of the resulting cycloolefin-based resin formed article is normally 0.001 to 10 mm, preferably 0.005 to 1 mm, and more preferably 0.01 to 0.5 mm.

When using the method (a), (b), or (c), the heating temperature when polymerizing the polymerizable composition is normally 30 to 250° C., preferably 50 to 200° C., and more preferably 90 to 150° C. The polymerization time may be appropriately selected, but is normally 1 second to 20 minutes, and preferably 10 seconds to 5 minutes. A cycloolefin-based resin formed article that includes only a small amount of unreacted monomers can be obtained by heating the polymerizable composition under the above conditions.

The weight average molecular weight of the polymer that forms the cycloolefin-based resin formed article according to one embodiment of the invention is normally 5,000 to 500,000, and preferably 10,000 to 100,000. Note that the weight average molecular weight of the polymer refers to a polystyrene-equivalent value determined by gel permeation chromatography using tetrahydrofuran as the solvent.

Since the cycloolefin-based resin formed article according to one embodiment of the invention is obtained by subjecting the polymerizable composition according to one embodiment of the invention to bulk polymerization, the cycloolefin-based resin formed article exhibits excellent adhesion when compression-bonded to a metal material. Therefore, the cycloolefin-based resin formed article according to one embodiment of the invention is preferably used as a material for forming a metal-resin composite.

3) Laminate

A laminate according to one embodiment of the invention includes a metal foil, and a cycloolefin-based resin layer that is situated adjacent to the metal foil and formed by subjecting the polymerizable composition according to one embodiment of the invention to bulk polymerization.

Examples of the metal foil included in the laminate include those mentioned above in connection with the support used for the method (a).

The laminate according to one embodiment of the invention is obtained by utilizing a metal foil as the support when implementing the method (a), for example.

The laminate according to one embodiment of the invention may also be produced by stacking a sheet-like cycloolefin-based resin formed article (obtained using the method (a), (b), or (c)) and a metal foil so that the resin of the resin formed article is situated opposite to the metal foil, and hot-pressing the resulting laminate.

The hot-pressing pressure is normally 0.5 to 20 MPa, and preferably 1 to 10 MPa. The laminate may be hot-pressed under vacuum or reduced pressure. The laminate may be hot-pressed using a known press having a flat press mold, or a press molding machine used for a sheet molding compound (SMC) or a bulk molding compound (BMC), for example.

The laminate according to one embodiment of the invention may include a single layer formed of the metal foil, or may include two or more layers formed of the metal foil. The laminate according to one embodiment of the invention may include a single layer formed of a sheet-like cycloolefin-based resin formed article, or may include two or more layers formed of a sheet-like cycloolefin-based resin formed article.

The thickness of the laminate according to one embodiment of the invention is not particularly limited, but is normally 1 μm to 10 mm.

Since the laminate according to one embodiment of the invention includes the metal foil, and the cycloolefin-based resin layer that is situated adjacent to the metal foil and formed by subjecting the polymerizable composition according to one embodiment of the invention to bulk polymerization, the laminate has an advantage in that the cycloolefin-based resin layer exhibits excellent adhesion to the metal foil (layer).

The laminate according to one embodiment of the invention is thus preferably used as a printed circuit board material such as a resin-coated copper (RCC) and a copper-clad laminate (CCL).

EXAMPLES

The invention is further described below by way of examples and comparative examples. Note that the invention is not limited to the following examples. The units "parts" and "%" used in connection with the examples and the comparative examples respectively refer to "parts by weight" and "wt %" unless otherwise indicated.

Production Example 1: Synthesis of 4,5-epoxytricyclo[5.2.1.0$^{2,6}$]dec-8-ene

A three-necked reactor equipped with a thermometer, a dropping funnel, and a stirrer (in which the internal atmosphere had been replaced by nitrogen gas) was charged with 50.0 g (378.2 mmol) of dicyclopentadiene, 3.39 g (9.46 mmol) of hexadecylpyridinium chloride monohydrate, and 250 mL of chloroform to effect dissolution. A solution prepared by dissolving 5.45 g of 12-tungsto(VI) phosphoric acid n-hydrate in 42.88 g (378.2 mmol) of a 30% hydrogen peroxide aqueous solution was added dropwise to the solution contained in the reactor over 30 minutes while stirring the solution, and the mixture was stirred at room temperature for 3 hours. After the addition of 150 mL of distilled water and 100 mL of a saturated sodium chloride solution to the mixture contained in the reactor, the organic layer was isolated preparatively by performing a liquid separation operation. The organic layer was dried over anhydrous sodium sulfate, and sodium sulfate was filtered off. The filtrate was concentrated, and the concentrate was purified by silica gel column chromatography (ethyl acetate:n-hexane=1.5:18.5 (volume ratio)) to obtain 26.3 g of 4,5-epoxytricyclo[5.2.1.0$^{2,6}$]dec-8-ene as a white solid (yield: 47%).

The structure of the product was identified by $^1$H-NMR.

Production Example 2: Preparation of Catalyst Solution

A glass flask provided with a stirring bar was charged with 0.127 parts of a metathesis polymerization catalyst (benzylidene(1,3-dimesityl-4-imidazolidin-2-ylidene)(tricyclohexylphosphine) ruthenium dichloride), 0.191 parts of a polymerization retarder (triphenylphosphine), and 2.5 parts of toluene, and the mixture was stirred at 40° C. for 30 minutes to prepare a catalyst solution.

Example 1

20 parts of 4,5-epoxytricyclo[5.2.1.0$^{2,6}$]dec-8-ene (DCP-ME) obtained in Production Example 1, 48 parts of dicyclopentadiene (DCP), 32 parts of tetracyclododecene (TCD), 0.5 parts of a chain transfer agent 1 (1-hexene), and 0.5 parts of an antioxidant 1 (pentaerythritol tetrakis[3-(3,5-di-tert-butyl-4-hydroxyphenyl)propionate] ("Irganox 1010" manufactured by BASF)) were mixed to prepare a monomer solution. After cooling the monomer solution and the catalyst solution obtained in Production Example 2 to 0° C., the catalyst solution was added to the monomer solution in an amount of 0.8 mL per 100 g of the monomer solution, and the mixture was stirred to prepare a polymerizable composition 1.

A spacer having a thickness of 3 mm was sandwiched between two glass sheets covered with a release film to obtain a mold.

The polymerizable composition 1 was injected into the mold (i.e., injected into the space between the glass sheets), and heated at 120° C. for 5 minutes (i.e., subjected to bulk polymerization) using an oven in which the internal atmosphere had been replaced by nitrogen gas. The resulting polymer was cooled, and removed from the mold to obtain a sheet-like resin formed article 1 having a thickness of 3 mm. An electrodeposited copper foil subjected to a coupling treatment (thickness: 18 μm) (AMFN1/2Oz, Rz: approximately equal to 2.1 μm, manufactured by JX Nippon Mining & Metals Corporation) was placed on each side of the sheet-like resin formed article 1 so that the surface subjected to a coupling treatment was situated opposite to the sheet-like resin formed article 1, and the sheet-like resin formed article 1 was pressed at 180° C. for 10 minutes under a pressure of 2 MPa to obtain a laminate 1.

Example 2

A polymerizable composition 2 was prepared in the same manner as in Example 1, except that the amount of DCP-ME, the amount of DCP, and the amount of TCD were respectively changed to 10 parts, 54 parts, and 36 parts, and a sheet-like resin formed article 2 and a laminate 2 were produced using the polymerizable composition 2.

Example 3

A polymerizable composition 3 was prepared in the same manner as in Example 1, except that the amount of DCP-ME, the amount of DCP, and the amount of TCD were respectively changed to 5 parts, 57 parts, and 38 parts, and a sheet-like resin formed article 3 and a laminate 3 were produced using the polymerizable composition 3.

Comparative Example 1

A polymerizable composition 4 was prepared in the same manner as in Example 1, except that DCP-ME was not used, and the amount of DCP and the amount of TCD were respectively changed to 60 parts and 40 parts, and a sheet-like resin formed article 4 and a laminate 4 were produced using the polymerizable composition 4.

Comparative Example 2

60 parts of DCP, 40 parts of TCD, 1.8 parts of a chain transfer agent 2 (allyl methacrylate), 0.5 parts of the antioxidant 1, and 1.1 parts of a crosslinking agent 1 (di-tert-butyl peroxide ("KAYABUTYL D" manufactured by Kayaku Akzo Corporation)) were mixed to prepare a monomer solution. After cooling the monomer solution and the catalyst solution obtained in Production Example 2 to 0° C., the catalyst solution was added to the monomer solution in an amount of 0.8 mL per 100 g of the monomer solution to obtain a polymerizable composition 5.

A sheet-like resin formed article 5 was produced in the same manner as in Example 1. A laminate 5 was produced in the same manner as in Example 1, except that the sheet-like resin formed article 5 was used instead of the sheet-like resin formed article 1, and pressed at 180° C. for 30 minutes under a pressure of 2 MPa.

The properties of the sheet-like resin formed articles and the laminates obtained in Examples and Comparative Examples were measured and evaluated as described below. The results are shown in Table 1.

Weight Average Molecular Weight (Mw)

The sheet-like resin formed article (sheet-like resin formed articles 1 to 5) was crushed, and 20 mg of the crushed pieces were immersed in 5 mL of tetrahydrofuran to extract a soluble component to obtain a sample solution. The sample solution was subjected to gel permeation chromatography (eluant: tetrahydrofuran) to determine the standard polystyrene-equivalent weight average molecular weight (Mw).

Polymerization Conversion Ratio

The sheet-like resin formed article (sheet-like resin formed articles 1 to 5) was crushed, and 0.3 g of the crushed pieces were immersed in 3.5 mL of tolune to extract a soluble component to obtain a sample solution. The sample solution was subjected to gas chromatography to determine the residual monomer content. The polymerization conversion ratio of the monomers was calculated using the residual monomer content.

Glass Transition Temperature (Tg)

The sheet-like resin formed articles 1 to 4 were cut to dimensions of 5×5 mm using a cutter ("Labo Cutter MC-120" manufactured by Maruto Instrument Co., Ltd.), and subjected to thermomechanical analysis (TMA) (expansion-compression method) using a thermomechanical analyzer ("EXSTAR TMA/SS7100" manufactured by SII NanoTechnology Inc.). The glass transition temperature (Tg) was calculated from the resulting data.

The sheet-like resin formed article 5 was cured by heating the sheet-like resin formed article 5 at 180° C. for 30 minutes, and the glass transition temperature (Tg) was measured in the same manner as described above.

Peel Strength

The peel strength when the copper foil was peeled from the laminates 1 to 5 was measured in accordance with JIS C 6481.

The peel strength was also measured after heating the laminates 1 to 5 at 150° C. for 168 hours. Note that the copper foil bulged when the laminate 5 was heated at 150° C. for 168 hours, and the peel strength was not measured.

TABLE 1

|  |  | Example | | | Comparative Example | |
|---|---|---|---|---|---|---|
|  |  | 1 | 2 | 3 | 1 | 2 |
| Polymerizable composition (parts) | DCP-ME | 20 | 10 | 5 | — | — |
|  | DCP | 48 | 54 | 57 | 60 | 60 |
|  | TCD | 32 | 36 | 38 | 40 | 40 |
|  | Chain transfer agent 1 | 0.5 | 0.5 | 0.5 | 0.5 | — |
|  | Chain transfer agent 2 | — | — | — | — | 1.8 |
|  | Antioxidant 1 | 0.5 | 0.5 | 0.5 | 0.5 | 0.5 |
|  | Crosslinking agent 1 | — | — | — | — | 1.1 |
| Weight average molecular weight | | 51,000 | 54,000 | 56,000 | 57,000 | 34,000 |
| Polymerization conversion ratio (%) | | 98 | 99 | 99 | 99 | 96 |
| Glass transition temperature (° C.) | | 158 | 159 | 157 | 155 | 140 |
| Peel strength (N/cm) | Before heating | 10 | 8 | 6 | 1 | 8 |
|  | After heating | 8 | 6 | 5 | 1 | Bulge occurred |

The following were confirmed from the results shown in Table 1.

The resin formed articles 1 to 3 obtained in Examples 1 to 3 had a low unreacted monomer content and a low low-molecular-weight volatile content. Therefore, the resin formed articles 1 to 3 had a high glass transition temperature. The laminates 1 to 3 respectively produced using the resin formed articles 1 to 3 exhibited excellent peel strength (i.e., adhesion between the metal and the resin layer was high).

The laminate 4 of Comparative Example 1 that was produced using the polymerizable composition 4 that did not include DCP-ME exhibited low peel strength.

The laminate 5 of Comparative Example 2 in which a crosslinked structure was formed using the chain transfer agent 2 had a low glass transition temperature as compared with the laminates 1 to 3 of Examples 1 to 3 due to the presence of unreacted components, and the copper foil bulged when the laminate 5 was heated. It is considered that the peel strength of the copper foil significantly decreased due to heating, and the copper foil bulged due to volatilization of a volatile component from the sheet-like resin formed article.

The invention claimed is:

1. A polymerizable composition comprising a cycloolefin-based monomer (α) represented by a formula (I), a cycloolefin-based monomer (β) other than the cycloolefin-based monomer (α), and a polymerization catalyst,
   an amount of the cycloolefin-based monomer (β) is 10 to 99.5 parts by weight based on 100 parts by weight of the cycloolefin-based monomer (α) and the cycloolefin-based monomer (β) in total,

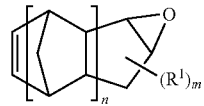 (I)

wherein $R^1$ is a substituent selected from a group consisting of a hydrocarbon group having 1 to 10 carbon atoms, a halogen atom, and a hydrocarbon group having 1 to 10 carbon atoms that is substituted with a halogen atom, m is an integer from 0 to 6n+6, provided that one or more $R^1$ are bonded at an arbitrary position when m is equal to or larger than 1, and $R^1$ are either identical or different when m is equal to or larger than 2, and n is an integer from 1 to 3 wherein the polymerization catalyst is a metathesis polymerization catalyst.

2. The polymerizable composition according to claim 1, wherein the cycloolefin-based monomer represented by the formula (I) is 4,5-epoxytricyclo[$5.2.1.0^{2,6}$]dec-8-ene.

3. The polymerizable composition according to claim 1, wherein the polymerization catalyst is a ruthenium carbene complex.

4. A cycloolefin-based polymer obtained by polymerizing the polymerizable composition according to claim 1.

5. A cycloolefin-based resin formed article obtained by subjecting the polymerizable composition according to claim 1 to bulk polymerization.

6. A laminate comprising a metal foil, and a cycloolefin-based resin layer that is situated adjacent to the metal foil and formed by subjecting the polymerizable composition according to claim 1 to bulk polymerization.

* * * * *